(12) United States Patent
Honma et al.

(10) Patent No.: US 7,247,900 B2
(45) Date of Patent: Jul. 24, 2007

(54) DIELECTRIC DEVICE HAVING DIELECTRIC FILM TERMINATED BY HALOGEN ATOMS

(75) Inventors: Kazunari Honma, Matsudo (JP); Shigeharu Matsushita, Katano (JP)

(73) Assignee: Sanyo Electric Co., Ltd., Osaka (JP)

( * ) Notice: Subject to any disclaimer, the term of this patent is extended or adjusted under 35 U.S.C. 154(b) by 385 days.

(21) Appl. No.: 10/631,858

(22) Filed: Aug. 1, 2003

(65) Prior Publication Data

US 2004/0029399 A1    Feb. 12, 2004

(30) Foreign Application Priority Data

Aug. 12, 2002   (JP) .............................. 2002-234562

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ...................................... 257/295; 257/310

(58) Field of Classification Search ................ 257/295, 257/310

See application file for complete search history.

(56) References Cited

U.S. PATENT DOCUMENTS

| 4,581,099 | A | * | 4/1986 | Fukaya et al. ................. 438/96 |
| 6,046,469 | A | * | 4/2000 | Yamazaki et al. ........... 257/306 |
| 6,320,213 | B1 | * | 11/2001 | Kirlin et al. ................. 257/295 |
| 6,323,132 | B1 | * | 11/2001 | Hwang et al. .............. 438/706 |
| 6,783,998 | B2 | * | 8/2004 | Nakamura ...................... 438/3 |

FOREIGN PATENT DOCUMENTS

| JP | 11-068057 | 3/1999 |
| JP | 11-080181 | 3/1999 |
| JP | 2001-072416 | 3/2001 |

* cited by examiner

*Primary Examiner*—Howard Weiss
(74) *Attorney, Agent, or Firm*—Arent Fox LLP

(57) ABSTRACT

A dielectric device having excellent characteristics is provided. This dielectric device comprises such a first electrode layer that constituent elements located on its surface are terminated by halogen atoms and a dielectric film formed on the surface of the first electrode layer terminated by the halogen atoms. When the constituent elements for the first electrode layer located on the surface thereof are terminated by the halogen atoms in order to form a ferroelectric film having a bismuth layer structure, therefore, Bi constituting the ferroelectric film is inhibited from bonding to the constituent elements located on the surface of the first electrode layer.

8 Claims, 4 Drawing Sheets

DIELECTRIC DEVICE HAVING DIELECTRIC FILM TERMINATED BY HALOGEN ATOMS

BACKGROUND OF THE INVENTION

1. Field of the Invention

The present invention relates to a dielectric device and a method of manufacturing a dielectric device, and more particularly, it relates to a dielectric device having a dielectric film formed on an electrode layer and a method of manufacturing such a dielectric device.

2. Description of the Background Art

In general, a dielectric device having a ferroelectric film is expected for application to various fields such as that of electronics due to its characteristics such as ferroelectricity. For example, research is made on a nonvolatile ferroelectric memory utilizing polarization hysteresis or the like.

A conventional ferroelectric film is manufactured through a dry process or a wet process. The dry process includes sputtering, vacuum deposition, laser absorption, MOCVD (metal organic chemical vapor deposition) or the like. In the dry process, however, it is difficult to stably form a ferroelectric film close to stoichiometry due to vapor pressures varying with elements. Further, the ferroelectric film is disadvantageously deteriorated in crystallinity. In addition, the manufacturing cost is disadvantageously increased due to low productivity and high-priced equipment. At present, therefore, the dry process is not yet put into practice.

According to the wet process, on the other hand, the chemical composition of the ferroelectric film can be precisely controlled and the ferroelectric film can be homogeneously formed at the molecular level as compared with the dry process. Further, it is also possible to form a ferroelectric film having a large area. In addition, the manufacturing cost can be reduced due to low-priced equipment, and the wet process is suitable for mass production. In general, therefore, the wet process is employed for forming a ferroelectric film on a relatively flat substrate. This wet process includes a sol-gel process employing a metal organic compound or MOD (metal organic decomposition) employing a solution prepared by dissolving metallic salt of carboxylic acid or the like in an organic solvent. The sol-gel process and the MOD are now schematically described.

According to the sol-gel process, a source solution containing a hydrolytic compound of each constituent metal serving as a raw material, a partial hydrolysate of the hydrolytic compound or a partial polycondensate of the hydrolytic compound is applied to a substrate. The coating of the source solution formed on the substrate is dried and thereafter heated at a prescribed temperature in the air or a water vapor atmosphere, thereby forming a film consisting of a metallic oxide on the substrate. Then, the film consisting of the metallic oxide formed on the substrate is baked at a temperature exceeding the crystallization temperature for the metallic oxide, thereby crystallizing the film of the metallic oxide. If the metallic oxide is SBT, the film is crystallized by performing heat treatment at a temperature of about 750° C.

According to the MOD, on the other hand, a source solution containing a heat-decomposable organic metal compound is applied to a substrate. The coating of the source solution formed on the substrate is heated in an atmosphere containing oxygen, thereby evaporating a solvent contained in the coating and thermally decomposing the metal compound. Thus, a film consisting of a metallic oxide is formed on the substrate. Then, the film consisting of the metallic compound formed on the substrate is baked at a temperature exceeding the crystallization temperature for the metallic oxide, thereby crystallizing the film of the metallic oxide. If the metallic oxide is SBT, the film is crystallized by performing heat treatment at a temperature of about 750° C.

In a conventional dielectric device, an electrode layer is formed on a substrate, and a ferroelectric film is thereafter formed on the electrode layer by the aforementioned sol-gel process or MOD.

FIG. 10 is a model diagram for illustrating the crystal structure of a ferroelectric film (SBT film) 105 formed on a lower electrode 104 consisting of Pt by the conventional sol-gel process or MOD. Referring to FIG. 10, elements shown by large characters are in the same plane, and those shown by small characters are in a plane different from that of the elements shown by the large characters.

When the ferroelectric film 105 consisting of $SrBi_2Ta_2O_9$ (SBT) having a bismuth layer structure is formed on the lower electrode 104 consisting of Pt by the sol-gel process or the MOD as shown in FIG. 10, the ferroelectric film 105 consisting of SBT generally exhibits a layer structure including a pseudo-perovskite layer 105a held between bismuth oxide layers 105b.

It is known that the a-axis direction and the b-axis direction of a ferroelectric substance having a bismuth layer structure exhibit polarization capacities larger than that in the c-axis direction. In order to obtain a dielectric device having excellent ferroelectricity, therefore, it is preferable to form a ferroelectric film on an electrode layer so that the a-axis direction and the b-axis direction are perpendicular to the surface of the electrode layer.

If the ferroelectric film 105 consisting of SBT having a bismuth layer structure is formed on the lower electrode 104 consisting of Pt by the conventional sol-gel process or MOD, however, the ferroelectric film 105 is so easily formed on the lower electrode 104 that the a-axis direction and the b-axis direction of the ferroelectric film 105 are parallel to the surface of the lower electrode 104 as shown in FIG. 10. This is conceivably for the following reason: Bi constituting the bismuth oxide layers 105b easily bonds to Pt constituting the lower electrode 104 due to catalytic action of Pt. When Bi bonds to Pt in this manner, the bismuth oxide layers 105b are conceivably easily formed to extend in parallel with the surface of the lower electrode 104 consisting of Pt. In this case, the a-axis direction and the b-axis direction of the ferroelectric film 105 are parallelized to the surface of the lower electrode 104.

As described above, the a-axis direction and the b-axis direction of the ferroelectric film 105 are parallelized to the surface of the lower electrode 104 consisting of Pt when a wet process such as the sol-gel process or MOD is employed, and hence it is difficult to attain excellent ferroelectricity in general.

In the conventional method of forming a ferroelectric film on an electrode layer by the sol-gel process or MOD, further, heat treatment must disadvantageously be performed at a high temperature of about 750° C. for crystallizing a metal oxide (ferroelectric substance), as hereinabove described.

SUMMARY OF THE INVENTION

An object of the present invention is to provide a dielectric device capable of attaining excellent characteristics.

In order to attain the aforementioned object, a dielectric device according to a first aspect of the present invention comprises such a first electrode layer that constituent elements located on its surface are terminated by halogen atoms and a dielectric film formed on the surface of the first electrode layer terminated by the halogen atoms.

In the dielectric device according to the first aspect, the dielectric film is formed on the surface of the first electrode layer whose constituent elements located on its surface are terminated by the halogen atoms as hereinabove described. When the constituent elements of the first electrode layer located on its surface are terminated by the halogen atoms in order to form a ferroelectric film having a bismuth layer structure, for example, Bi constituting the ferroelectric film can be inhibited from bonding to the constituent elements located on the surface of the first electrode layer. Therefore, the ferroelectric film can be formed on the surface of the first electrode layer so that a bismuth layer is substantially perpendicular to the surface of the first electrode layer. Thus, the a-axis direction and the b-axis direction of the ferroelectric film can be rendered substantially perpendicular to the surface of the first electrode layer, so that the ferroelectric film exhibits a large polarization capacity. Consequently, the dielectric device can attain excellent characteristics. Further, the constituent elements located on the surface of the first electrode layer are so terminated by the halogen atoms as to modify the surface of the first electrode layer, whereby the crystallization temperature for the dielectric film formed on the first electrode layer can be reduced.

In the aforementioned dielectric device according to the first aspect, the first electrode layer preferably contains at least one element selected from a group consisting of Pt, Ir, Pd and Ru. According to this structure, the dielectric device can easily attain excellent characteristics by terminating the constituent elements of the first electrode layer containing such an element by the halogen atoms.

In the aforementioned dielectric device according to the first aspect, the halogen atoms are preferably fluorine atoms. It has been experimentally confirmed that the surface of the first electrode layer can be easily terminated when employing fluorine atoms. In this case, the first electrode layer may contain Pt, and platinum fluoride may be formed on the surface of the first electrode layer.

In the aforementioned dielectric device according to the first aspect, the dielectric film preferably includes a ferroelectric film having a bismuth layer structure. According to this structure, the ferroelectric film can be easily formed so that the a-axis direction and the b-axis direction of the ferroelectric film having a bismuth layer structure are substantially perpendicular to the surface of the first electrode layer by terminating the constituent elements of the first electrode layer serving as an underlayer by the halogen atoms.

In the aforementioned structure including the ferroelectric film having a bismuth layer structure, the ferroelectric film having a bismuth layer structure is preferably an $SrBi_2Ta_2O_9$ (SBT) film. When consisting of such an SBT film, the ferroelectric film can be easily formed so that the a-axis direction and the b-axis direction thereof are substantially perpendicular to the surface of the first electrode layer.

In the aforementioned structure including the ferroelectric film having a bismuth layer structure, a bismuth layer is preferably formed to be substantially perpendicular to the first electrode layer in the ferroelectric film having a bismuth layer structure. According to this structure, the ferroelectric film can be so easily formed as to exhibit a large polarization capacity.

The aforementioned dielectric device according to the first aspect preferably further comprises a second electrode layer formed on the dielectric film. According to this structure, a capacitor element consisting of the first electrode layer, the dielectric film and the second electrode layer can be obtained.

The aforementioned dielectric device according to the first aspect preferably further comprises an adherent layer formed under the first electrode layer. According to this structure, the adherent layer can inhibit the first electrode layer from separation. In this case, the adherent layer may include an IrSiN film.

A method of manufacturing a dielectric device according to a second aspect of the present invention comprises steps of terminating constituent elements located on the surface of a first electrode layer by halogen atoms and forming a dielectric film on the surface of the first electrode layer terminated by the halogen atoms.

In the method of manufacturing a dielectric device according to the second aspect, the constituent elements located on the surface of the first electrode layer are terminated by the halogen atoms and the dielectric film is thereafter formed on the surface of the first electrode as hereinabove described. When the constituent elements of the first electrode layer located on the surface of the first electrode layer are terminated by the halogen atoms in order to form a ferroelectric film having a bismuth layer structure, for example, Bi constituting the ferroelectric film can be inhibited from bonding to the constituent elements located on the surface of the first electrode layer. Therefore, the ferroelectric film can be formed on the surface of the first electrode layer so that a bismuth layer is substantially perpendicular to the surface of the first electrode layer. Thus, the a-axis direction and the b-axis direction of the ferroelectric film can be rendered substantially perpendicular to the surface of the first electrode layer, so that the ferroelectric film can easily exhibit a large polarization capacity. Consequently, the dielectric device can attain excellent characteristics. Further, the constituent elements located on the surface of the first electrode layer are so terminated by the halogen atoms as to modify the surface of the first electrode layer, whereby the crystallization temperature for the dielectric film formed on the first electrode layer can be reduced.

In the aforementioned method of manufacturing a dielectric device according to the second aspect, the step of terminating the constituent elements by the halogen atoms preferably includes a step of exposing the surface of the first electrode layer into either a plasma or a solution containing halogen ions thereby terminating the constituent elements located on the surface of the first electrode layer by the halogen atoms. According to this structure, the constituent elements located on the surface of the first electrode layer can be easily terminated by the halogen atoms.

The aforementioned method of manufacturing a dielectric device according to the second aspect preferably further comprises a step of performing heat treatment after formation of the dielectric film thereby crystallizing the dielectric film. According to this structure, the dielectric film formed on the surface of the first electrode layer modified by termination with the halogen atoms can be easily crystallized at a low temperature. Consequently, a substrate can be inhibited from deformation or chemical reaction with the dielectric film resulting from high-temperature heat treatment. Further, a material incapable of withstanding high-temperature heat treatment is so usable that functional enhancement can be attained by bringing the dielectric film into a multilayer structure.

In the aforementioned method of manufacturing a dielectric device according to the second aspect, the halogen atoms are preferably fluorine atoms. It has been experimentally confirmed that the surface of the first electrode layer can be easily terminated when employing fluorine atoms. In this case, the first electrode layer may contain Pt, and platinum fluoride may be formed on the surface of the first electrode layer.

In the aforementioned method of manufacturing a dielectric device according to the second aspect, the step of forming the dielectric film preferably includes a step of forming a ferroelectric film having a bismuth layer structure. According to this structure, the ferroelectric film can be easily formed so that the a-axis direction and the b-axis direction of the ferroelectric film having a bismuth layer structure are substantially perpendicular to the surface of the first electrode layer by terminating the constituent elements of the first electrode layer serving as an underlayer by the halogen atoms.

In the aforementioned structure including the step of forming the ferroelectric film having a bismuth layer structure, the ferroelectric film having a bismuth layer structure is preferably an $SrBi_2Ta_2O_9$ (SBT) film. When consisting of such an SBT film, the ferroelectric film can be easily formed so that the a-axis direction and the b-axis direction thereof are substantially perpendicular to the surface of the first electrode layer.

In the aforementioned structure including the step of forming the ferroelectric film having a bismuth layer structure, the step of forming the ferroelectric film having a bismuth layer structure preferably includes a step of forming the ferroelectric film having a bismuth layer structure so that a bismuth layer is substantially perpendicular to the first electrode layer. According to this structure, the ferroelectric film can be so easily formed as to exhibit a large polarization capacity.

The aforementioned method of manufacturing a dielectric device according to the second aspect preferably further comprises a step of forming a second electrode layer on the dielectric film. According to this structure, a capacitor element consisting of the first electrode layer, the dielectric film and the second electrode layer can be formed.

The aforementioned method of manufacturing a dielectric device according to the second aspect preferably further comprises a step of forming an adherent layer under the first electrode layer. According to this structure, the adherent layer can inhibit the first electrode layer from separation. In this case, the adherent layer may include an IrSiN film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention is now described with reference to the drawings.

The structure of a dielectric device according to this embodiment is first described with reference to FIGS. 1 and 2. Referring to FIG. 2, elements shown by large characters are in the same plane, and those shown by small characters are in a plane different from that of the elements shown by the large characters.

Figure 1:
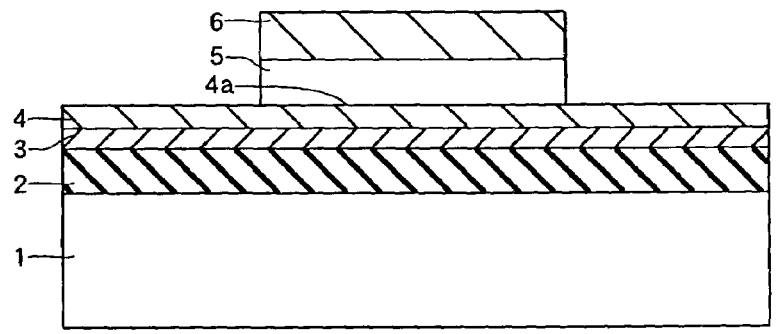
FIG. 1 is a sectional view of a dielectric device according to an embodiment of the present invention.
Figure 2:
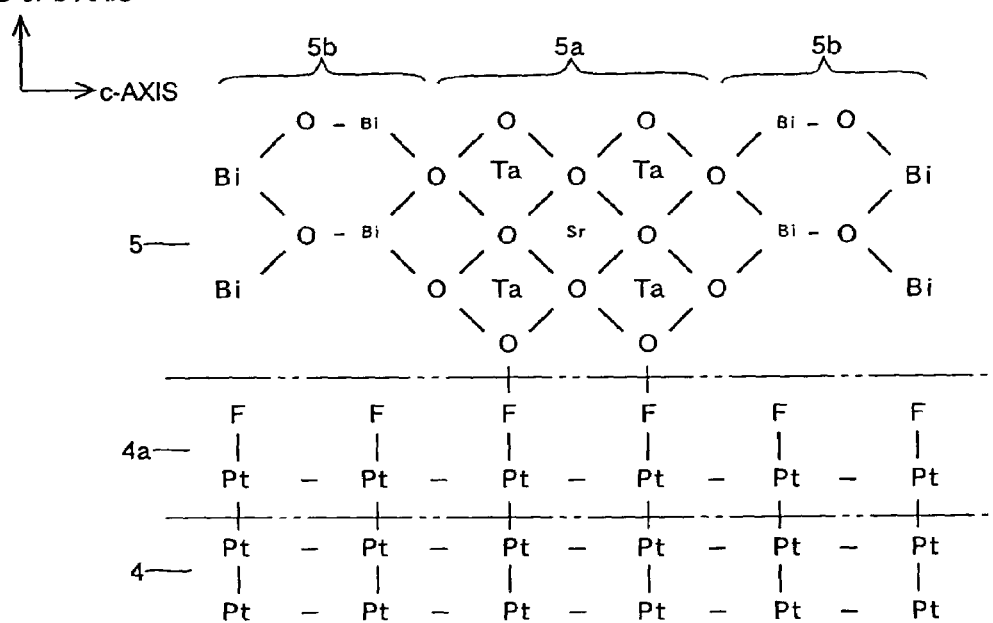
FIG. 2 is a model diagram for illustrating the crystal structure of a ferroelectric film (SBT film) formed on an electrode layer, consisting of Pt, of the dielectric device according to the embodiment shown in FIG. 1.

In the dielectric device according to this embodiment, an $SiO_2$ film 2 having a thickness of about 350 nm is formed on an Si substrate 1, as shown in FIG. 1. An adherent layer 3 consisting of IrSiN having a thickness of about 100 nm is formed on the $SiO_2$ film 2. A lower electrode 4 consisting of Pt having a thickness of about 100 nm is formed on the adherent layer 3. The adherent layer 3 has a function of improving adhesion between the $SiO_2$ film 2 and the lower electrode 4 for preventing the lower electrode 4 from separation. The lower electrode 4 is an example of the "first electrode layer" in the present invention.

According to this embodiment, fluorine atoms F terminate platinum atoms Pt located on the surface 4a of the lower electrode 4, as shown in FIG. 2. The platinum atoms Pt are examples of the "constituent elements of the first electrode" in the present invention, and the fluorine atoms F are examples of the "halogen atoms" in the present invention. A ferroelectric film 5 of about 100 nm in thickness consisting of SBT having a bismuth layer structure is formed on the surface 4a of the lower electrode 4 terminated by the fluorine atoms F. The ferroelectric film 5 has a layer structure including a pseudo-perovskite layer 5a held between bismuth oxide layers 5b. The a-axis direction and the b-axis direction of the ferroelectric film 5 are perpendicular to the surface 4a of the lower electrode 4. In other words, the bismuth oxide layers 5b are perpendicular to the surface 4a of the lower electrode 4. An oxygen atom 0 of each oxygen octahedron having a center of Ta constituting the pseudo-perovskite layer 5a bonds to one of the fluorine atoms F terminating the platinum atoms Pt. The ferroelectric film 5 is an example of the "dielectric film" in the present invention.

As shown in FIG. 1, the ferroelectric film 5 is so formed on the surface 4a of the lower electrode 4 as to partially expose the surface 4a. An upper electrode 6 consisting of Pt is formed on the ferroelectric film 5.

According to this embodiment, the fluorine atoms F terminate the platinum atoms Pt located on the surface 4a of the lower electrode 4 consisting of Pt as hereinabove described, whereby Bi constituting the ferroelectric film 5 can be inhibited from bonding to Pt located on the surface 4a of the lower electrode 4. Therefore, the ferroelectric film 5 can be so formed on the surface 4a of the lower electrode 4 that the bismuth oxide layers 5b are substantially perpendicular to the surface 4a of the lower electrode 4. Thus, the a-axis direction and the b-axis direction of the ferroelectric film 5 can be rendered substantially perpendicular to the surface 4a of the lower electrode 4, whereby the ferroelectric film 5 can be so obtained as to exhibit a large polarization capacity. Consequently, the dielectric device can attain excellent characteristics.

A method of manufacturing the dielectric device according to this embodiment is now described with reference to FIGS. 1 to 8.

Figure 3:
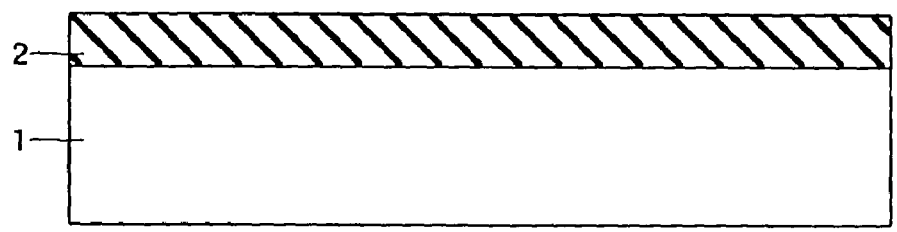
FIGS. 3 to 5 are sectional views for illustrating a method of manufacturing the dielectric device according to the embodiment shown in FIG. 1.

First, the surface of the Si substrate 1 is heat-treated thereby forming the $SiO_2$ film 2 having the thickness of about 350 nm on the Si substrate 1, as shown in FIG. 3.

Figure 4:
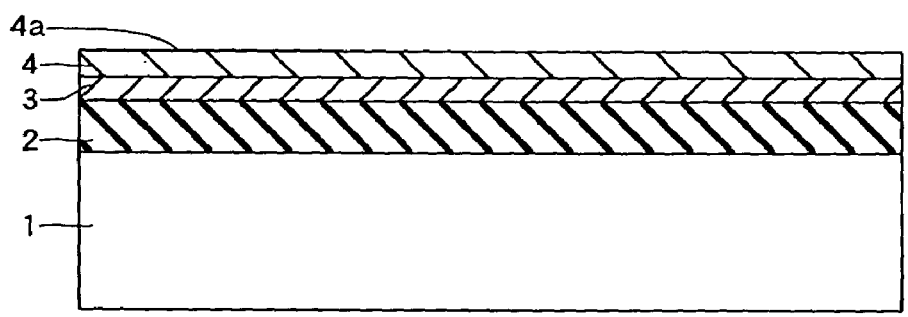

As shown in FIG. 4, the adherent layer 3 of IrSiN having the thickness of about 100 nm and the lower electrode 4 of Pt having the thickness of about 100 nm are successively formed on the $SiO_2$ film 2 by sputtering.

According to this embodiment, the surface 4a of the lower electrode 4 is exposed into a plasma containing $CHF_3$, $CH_4$ and Ar as source gases thereby containing fluorine ions, for terminating the platinum atoms Pt located on the surface 4a of the lower electrode 4 by the fluorine atoms F, as shown in FIG. 2. Thus, platinum fluoride is formed on the surface 4a of the lower electrode 4.

Figure 5:
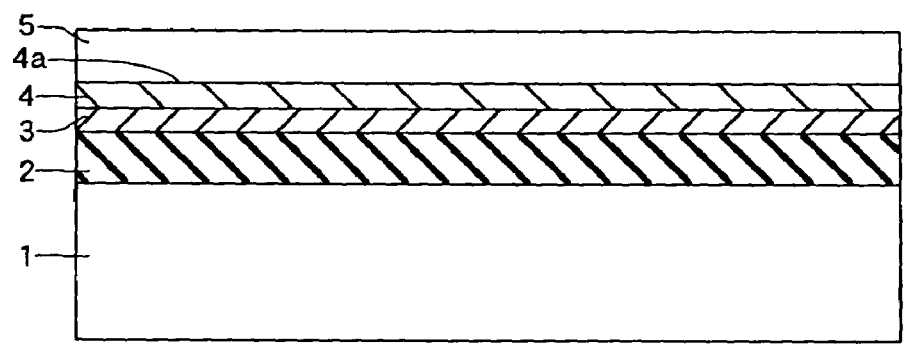
Figure 6:
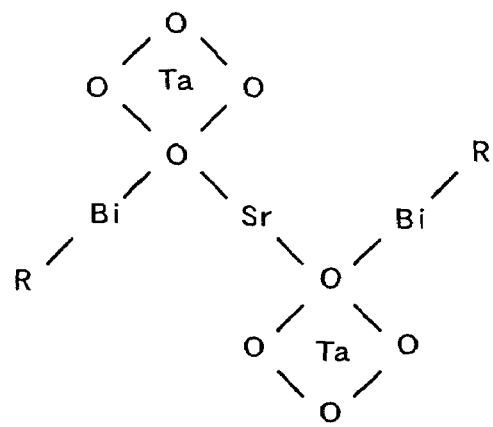
FIG. 6 is a model diagram for illustrating the molecular structure of a precursor employed for forming the dielectric device according to the embodiment shown in FIG. 1.

As shown in FIG. 5, the ferroelectric film 5 of about 100 nm in thickness consisting of SBT having a bismuth layer structure is formed on the surface 4a of the lower electrode 4 by the sol-gel process or MOD. More specifically, a solution (SBT solution) for SBT is applied to the surface 4a of the lower electrode 4 by spin coating at about 2000 rpm for about 30 seconds. The SBT solution is obtained by dissolving a composition, referred to as a precursor (see FIG. 6), prepared by the sol-gel process or MOD in a solvent such as ethanol, isopropyl alcohol, butanol or 2-ethylhexane for forming the ferroelectric film 5 of SBT. In the precursor, two oxygen octahedrons having centers of Ta are connected with each other through Sr as shown in FIG. 6. Bi bonds to oxygen atoms 0 bonded to Sr, while organic components R bond to Bi.

Thereafter heat treatment is performed in the atmosphere at about 200° C. for about 15 minutes, thereby evaporating the solvent component of the SBT solution applied onto the surface 4a of the lower electrode 4. Thus, the SBT solution applied onto the surface 4a of the lower electrode 4 forms the ferroelectric film 5 consisting of SBT. Thereafter main baking is performed in an oxygen atmosphere at about 650° C. for about 1 hour, thereby crystallizing the ferroelectric film 5 of SBT. Thus, the crystallized ferroelectric film 5 of SBT having a bismuth layer structure is formed on the surface 4a of the lower electrode 4 with the thickness of about 100 nm.

When the ferroelectric film 5 consisting of SBT is formed on the surface 4a of the lower electrode 4 consisting of Pt terminated by the fluorine atoms F through the sol-gel process or MOD as described above, Bi constituting the ferroelectric film 5 is inhibited from bonding to Pt constituting the lower electrode 4. Thus, the bismuth oxide layers 5b constituting the ferroelectric film 5 are formed substantially perpendicularly to the surface 4a of the lower electrode 4, as shown in FIG. 2. Therefore, the a-axis direction and the b-axis direction of the ferroelectric film 5 can be rendered substantially perpendicular to the surface 4a of the lower electrode 4, whereby the ferroelectric film 5 can be so formed as to exhibit a large polarization capacity. An oxygen atom 0 of each oxygen octahedron having the center of Ta constituting the pseudo-perovskite layer 5a bonds to one of the fluorine atoms F terminating the platinum atoms Pt located on the surface 4a of the lower electrode 4. Platinum fluoride ($PtF_6$) formed by fluoridizing the platinum atoms Pt by the fluorine atoms F is a strong oxidizer, which can oxidize $O_2$ to $O_2^+$ and form solid $O_2(PtF_6)$. It is assumable from the characteristics of $PtF_6$ that an oxygen atom O of each oxygen octahedron having the center of Ta constituting the pseudo-perovskite structure can easily bond to one of the fluorine atoms F.

Figure 7:
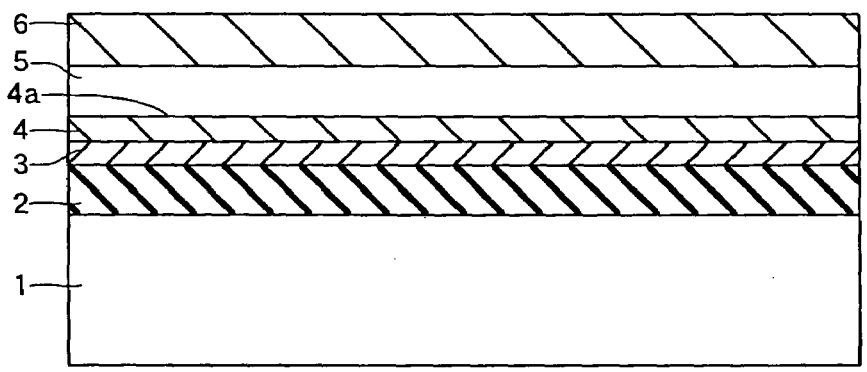
FIGS. 7 and 8 are sectional views for illustrating the method of manufacturing the dielectric device according to the embodiment shown in FIG. 1.

The upper electrode 6 of Pt is formed on the ferroelectric film 5 formed in the aforementioned manner by sputtering, as shown in FIG. 7.

Figure 8:
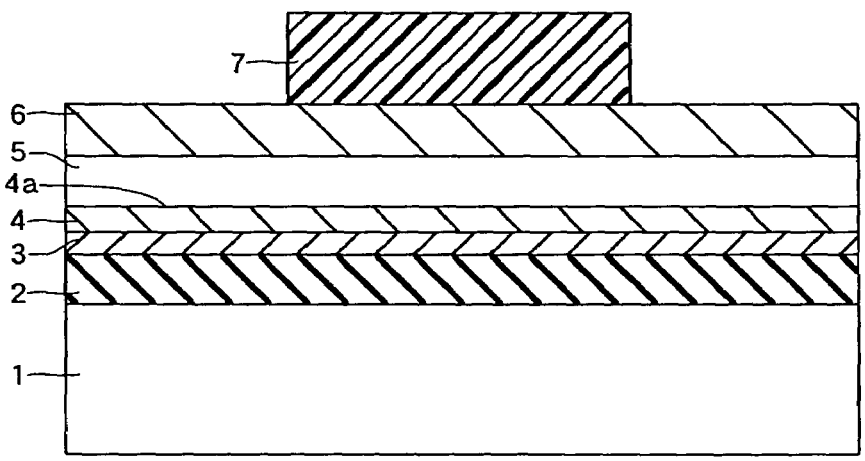

As shown in FIG. 8, a resist pattern 7 is formed on the upper electrode 6 by photolithography. The resist pattern 7 is employed as a mask for patterning the upper electrode 6 and the ferroelectric film 5 by dry etching. The upper electrode 6 is etched with $Cl_2$/Ar-based gas, while the ferroelectric film 5 is etched with $CF_4$/Ar-based gas. Thereafter the resist pattern 7 is removed thereby completing the dielectric device according to this embodiment as show in FIG. 1. Finally, heat treatment is performed in an oxygen atmosphere of about 650° C. for about 1 hour, in order to recover the dielectric device from etching damage.

Figure 9:
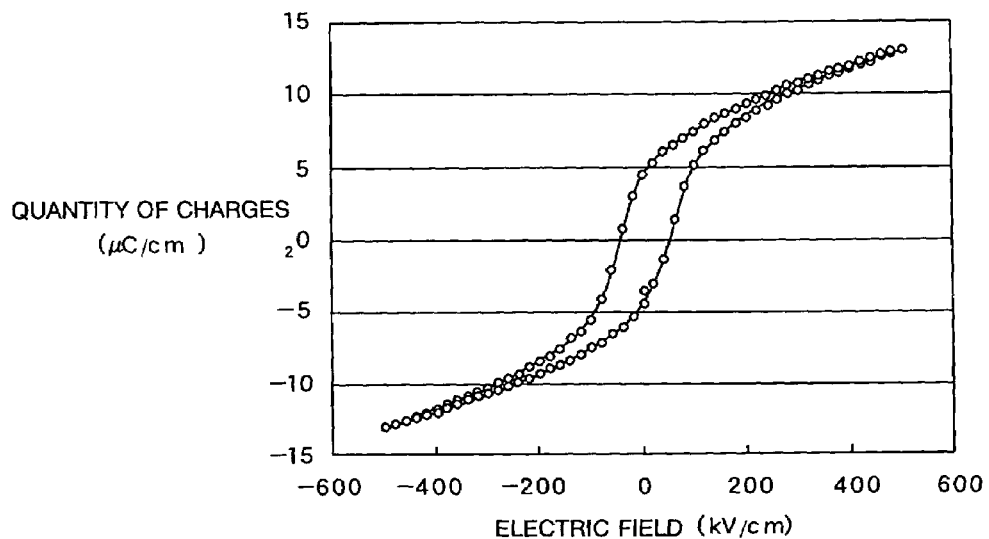
FIG. 9 is a graph showing the hysteresis of a dielectric device prepared in practice by the method of manufacturing the dielectric device according to the embodiment shown in FIGS. 3 to 8.
Figure 10:
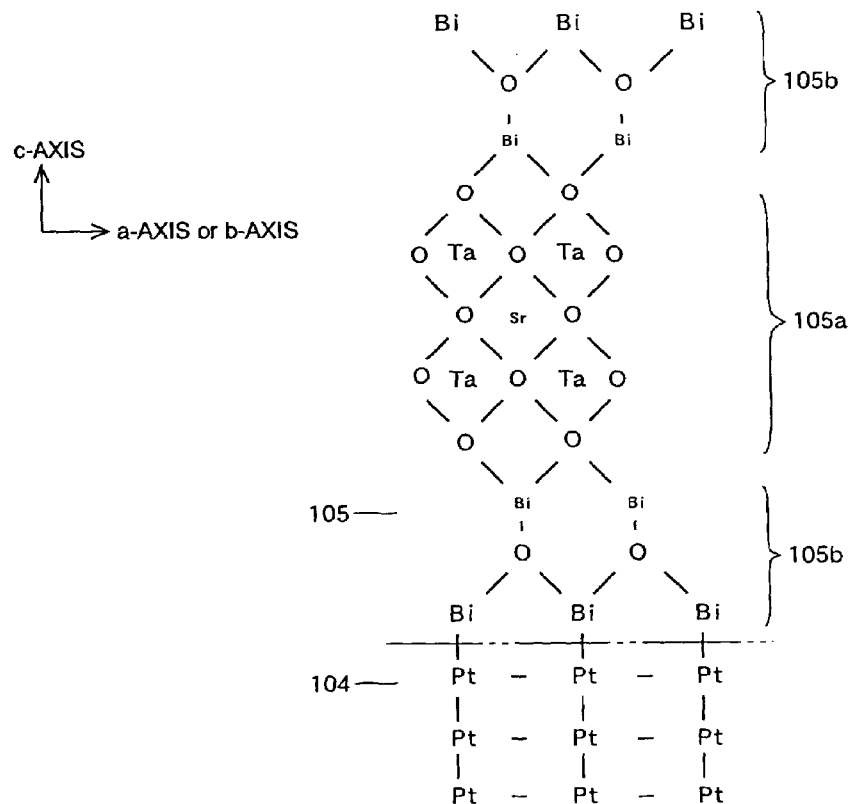
FIG. 10 is a model diagram for illustrating the crystal structure of a ferroelectric thin film formed on an electrode layer of a conventional dielectric device.

FIG. 9 is a graph showing the hysteresis of a dielectric device prepared in practice by the method of manufacturing the dielectric device according to this embodiment shown in FIGS. 3 to 8. Referring to FIG. 9, it has been proved that the dielectric device prepared by the method according to this embodiment exhibits an excellent polarization capacity of $2Pr=8$ $\mu C/cm^2$.

In the method according to this embodiment, the platinum atoms Pt located on the surface 4a of the lower electrode 4 are terminated by the fluorine atoms F as hereinabove described thereby modifying the surface 4a of the lower electrode 4, whereby the crystallization temperature for the ferroelectric film 5 can be reduced when the same is formed on the surface 4a of the lower electrode 4. In other words, the ferroelectric film 5 can be crystallized at a temperature of about 650° C., which is lower by about 100° C. than the crystallization temperature (about 750° C.) for a conventional ferroelectric film. Consequently, the substrate 1 can be inhibited from deformation or chemical reaction with the ferroelectric film 5 resulting from high-temperature heat treatment. Further, a material incapable of withstanding high-temperature heat treatment is so usable that functional enhancement can be attained by bringing the ferroelectric film 5 into a multilayer structure.

In the method according to this embodiment, the platinum atoms Pt located on the surface 4a of the lower electrode 4 can be easily terminated by the fluorine atoms F by exposing the surface 4a of the lower electrode 4 into the plasma containing fluorine ions, as hereinabove described.

Although the present invention has been described and illustrated in detail, it is clearly understood that the same is by way of illustration and example only and is not to be taken by way of limitation, the spirit and scope of the present invention being limited only by the terms of the appended claims.

For example, while the ferroelectric film 5 consisting of $SrBi_2Ta_2O_9$ (SBT) is formed on the lower electrode 4 in the aforementioned embodiment, the present invention is not restricted to this but a similar effect can be attained also when a ferroelectric film consisting of a ferroelectric substance having a bismuth layer structure expressed in any of the following general formulas is formed on an electrode layer:

$$(Bi_2O_2)^{2+}(A_{n-1}B_nO_{3n+1})^{2-}$$

where A represents Sr, Ca, Ba, Pb, Bi, K or Na, and B represents Ti, Ta, Nb, W or V.

When n=1:

$Bi_2WO_6$ $Bi_2VO_{5.5}$

When n=2:

$Bi_2O_3/SrTa_2O_6$ $Bi_2O_3/SrNb_2O_6$ $(SrBi_2Nb_2O_9)$

When n=3:

$Bi_2O_3/SrTa_2O_6/BaTiO_3$ $Bi_2O_3/SrTaO_6/SrTiO_3$ $Bi_2O_3/Bi_2Ti_3O_9$ $(Bi_4Ti_3O_{12})$:BIT

When n=4:

$Bi_2O_3/Sr_3Ti_4O_{12}$ $(Sr_3Bi_2Ti_4O_{15})$ $Bi_2O_3/Bi_2Ti_3O_9/SrTiO_3$ $(SrBi_4Ti_4O_{15})$

This is also effective in a ferroelectric substance having a bismuth layer structure obtained by partially replacing atoms contained in A with other atoms. For example, BLT:$Bi_2O_3$/$Bi_{1.25}La_{0.75}Ti_3O_9$ or the like is employable.

Further, this is also effective in a ferroelectric substance having a bismuth layer structure obtained by partially replacing atoms contained in B with other atoms. For example, BITW:$Bi_2O_3$/$Bi_2Ti_{2.97}W_{0.03}O_9$ or the like is employable.

In addition, this is also effective in a ferroelectric substance having a bismuth layer structure obtained by partially replacing atoms contained in A and B with other atoms. For example, BLTN:$Bi_2O_3$/$Bi_{1.25}La_{0.075}Ti_{2.97}Nb_{0.03}O_9$ or the like is employable.

While the lower electrode 4 consisting of Pt is formed on the Si substrate 1 in the aforementioned embodiment, the present invention is not restricted to this but a similar effect can be attained also when forming an electrode layer containing at least one element selected from a group consisting of Pt, Ir, Pd and Ru on a substrate. An electrode material other than the above may alternatively be employed.

While the lower electrode 4 is formed with the thickness of about 100 nm in the aforementioned embodiment, the present invention is not restricted to this but the electrode layer may be formed with a thickness in the range of about 10 nm to about 100 nm.

While the adherent layer 3 consisting of IrSiN is formed on the $SiO_2$ film 2 for preventing the lower electrode 4 from separation in the aforementioned embodiment, the present invention is not restricted to this but the adherent layer 3 may alternatively consist of another material. For example, the adherent layer 3 may conceivably consist of $TiO_2$, CoSiN, RuSiN, Ti, Pt/$TiO_2$, TaSiN, Pt, $IrO_2$, TiN or the like.

While the adherent layer 3 has the thickness of about 100 nm in the aforementioned embodiment, the present invention is not restricted to this but the adherent layer 3 may have a thickness in the range of about 10 nm to about 100 nm.

While the fluorine atoms F terminate the platinum atoms Pt located on the surface 4a of the lower electrode 4 in the aforementioned embodiment, the present invention is not restricted to this but constituent atoms of an electrode layer located on the surface of the electrode layer may be terminated by other halogen atoms. The other halogen atoms may conceivably be prepared from atoms of Cl, Br, I, At or the like, for example.

While the solution for forming the ferroelectric (SBT) film 5 is applied by spin coating in the aforementioned embodiment, the present invention is not restricted to this but another method such as dip coating or atomization may alternatively be employed.

While heat treatment is performed in the atmosphere at about 200° C. for about 15 minutes in order to evaporate the solvent component of the solution for forming the ferroelectric (SBT) film 5 applied onto the surface 4a of the lower electrode 4 in the aforementioned embodiment, the present invention is not restricted to this but heat treatment may alternatively be performed at about 150° C. to about 300° C. for about 3 minutes to about 30 minutes.

While main baking is performed in the oxygen atmosphere of about 650° C. for about 1 hour in order to crystallize the ferroelectric film 5 consisting of $SrBi_2Ta_2O_9$ (SBT) in the aforementioned embodiment, the present invention is not restricted to this but main baking may alternatively be performed under conditions of about 600° C. to about 700° C. for about 15 minutes to about 60 minutes.

While the main baking is performed for crystallizing the ferroelectric film 5 after evaporating the solvent component of the solvent for forming the ferroelectric (SBT) film 5 applied onto the surface 4a of the lower electrode 4 in the aforementioned embodiment, the present invention is not restricted to this but main baking may alternatively be performed after performing calcination for evaporating organic components etc. bonding to metal atoms. Further, application of the solution for forming the ferroelectric film 5 and calcination may be repeated several times in order to form the ferroelectric film 5 with a prescribed thickness. For example, calcination may be performed under conditions in the atmosphere at about 300° C. to about 500° C. or in an oxygen atmosphere for about 3 minutes to about 60 minutes.

While heat treatment is performed in the oxygen atmosphere of about 650° C. for about 1 hour in order to recover the dielectric device from etching damage in the aforementioned embodiment, the present invention is not restricted to this but the heat treatment may be performed under a temperature condition of about 600° C. to about 700° C.

What is claimed is:

1. A dielectric device comprising:
    such a first electrode layer that constituent elements located on its surface are terminated by halogen atoms; and
    a dielectric film formed on the surface of said first electrode layer terminated by said halogen atoms,
    wherein said first electrode layer contains at least one element selected from a group consisting of Pt, Ir, Pd and Ru and said halogen atoms are fluorine atoms.

2. The dielectric device according to claim 1, wherein said first electrode layer contains Pt, and platinum fluoride is formed on the surface of said first electrode layer.

3. The dielectric device according to claim 1, wherein said dielectric film includes a ferroelectric film having a bismuth layer structure.

4. The dielectric device according to claim 3, wherein said dielectric film having a bismuth layer structure is an $SrBi_2Ta_2O_9$ (SBT) film.

5. The dielectric device according to claim 3, wherein a bismuth layer is formed to be substantially perpendicular to said first electrode layer in said ferroelectric film having a bismuth layer structure.

6. The dielectric device according to claim 1, further comprising a second electrode layer formed on said dielectric film.

7. The dielectric device according to claim 1, further comprising an adherent layer formed under said first electrode layer.

8. The dielectric device according to claim 7, wherein said adherent layer includes an IrSiN film.

* * * * *

UNITED STATES PATENT AND TRADEMARK OFFICE
CERTIFICATE OF CORRECTION

PATENT NO. : 7,247,900 B2
APPLICATION NO. : 10/631858
DATED : July 24, 2007
INVENTOR(S) : Honma et al.

Page 1 of 1

It is certified that error appears in the above-identified patent and that said Letters Patent is hereby corrected as shown below:

Title Page, item 56, under "References Cited" section, other References
--Item I "Low Temperature Deposition Material"
Section 4 "New Deposition Material"
Ferroelectric Memory Advanced Process
September 13, 1999-- should be added Signed and Sealed this Twenty-third Day of February, 2010

David J. Kappos
*Director of the United States Patent and Trademark Office*